United States Patent
Sun et al.

(10) Patent No.: US 10,840,112 B2
(45) Date of Patent: *Nov. 17, 2020

(54) COATED ARTICLE AND SEMICONDUCTOR CHAMBER APPARATUS FORMED FROM YTTRIUM OXIDE AND ZIRCONIUM OXIDE

(71) Applicant: Applied Materials, Inc., Santa Clara, CA (US)

(72) Inventors: Jennifer Y. Sun, Mountain View, CA (US); Ren-Guan Duan, Fremont, CA (US); Jie Yuan, San Jose, CA (US); Li Xu, San Jose, CA (US); Kenneth S. Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/252,348

(22) Filed: Jan. 18, 2019

(65) Prior Publication Data

US 2019/0157113 A1 May 23, 2019

Related U.S. Application Data

(60) Continuation of application No. 13/998,723, filed on Nov. 26, 2013, now Pat. No. 10,242,888, which is a division of application No. 13/986,040, filed on Mar. 25, 2013, now Pat. No. 9,051,219, which is a continuation of application No. 13/199,521, filed on Aug. 31, 2011, now Pat. No. 8,623,527, which is a division of application No. 12/660,068, filed on Feb. 19, 2010, now Pat. No. 8,034,734, which is a continuation of application No. 11/796,210, filed on Apr. 27, 2007, now abandoned.

(51) Int. Cl.
*H01L 21/67* (2006.01)
*C04B 35/486* (2006.01)
*C04B 35/505* (2006.01)

(52) U.S. Cl.
CPC ...... *H01L 21/67011* (2013.01); *C04B 35/486* (2013.01); *C04B 35/505* (2013.01); *C04B 2235/3217* (2013.01); *C04B 2235/3225* (2013.01); *C04B 2235/3244* (2013.01); *C04B 2235/77* (2013.01); *C04B 2235/785* (2013.01); *C04B 2235/786* (2013.01); *C04B 2235/80* (2013.01); *C04B 2235/96* (2013.01); *C04B 2235/9607* (2013.01); *C04B 2235/9669* (2013.01)

(58) Field of Classification Search
CPC ............ C04B 35/505; H01L 21/67011
See application file for complete search history.

(56) References Cited

U.S. PATENT DOCUMENTS

| | | |
|---|---|---|
| 3,868,351 A | 2/1975 | Hand et al. |
| 4,098,612 A | 7/1978 | Rhodes et al. |
| 4,166,880 A | 9/1979 | Loferski et al. |
| 4,328,294 A | 5/1982 | Tanaka et al. |
| 4,328,295 A | 5/1982 | Tanaka et al. |
| 4,360,598 A | 11/1982 | Otagiri et al. |
| 4,370,393 A | 1/1983 | Watanabe et al. |
| 4,576,874 A | 3/1986 | Spengler et al. |
| 4,629,537 A | 12/1986 | Hsu |
| 4,645,716 A | 2/1987 | Harrington et al. |
| 4,656,455 A | 4/1987 | Tanino et al. |
| 5,011,761 A | 4/1991 | Cagnin et al. |
| 5,069,938 A | 12/1991 | Lorimer et al. |
| 5,102,496 A | 4/1992 | Savas |
| 5,162,133 A | 11/1992 | Bartha et al. |
| 5,366,585 A | 11/1994 | Robertson et al. |
| 5,407,121 A | 4/1995 | Koopman et al. |
| 5,413,877 A | 5/1995 | Griffith |
| 5,488,825 A | 2/1996 | Davis et al. |
| 5,488,925 A | 2/1996 | Kumada |
| 5,589,002 A | 12/1996 | Su |
| 5,605,637 A | 2/1997 | Shan et al. |
| 5,651,797 A | 7/1997 | Laube |
| 5,680,013 A | 10/1997 | Dornfest et al. |
| 5,746,875 A | 5/1998 | Maydan et al. |
| 5,762,748 A | 6/1998 | Banholzer et al. |
| 5,798,016 A | 8/1998 | Oehrlein et al. |
| 5,827,791 A | 10/1998 | Pauliny et al. |
| 5,879,523 A | 3/1999 | Wang et al. |
| 5,888,884 A | 3/1999 | Wojnarowski |
| 5,900,283 A | 5/1999 | Vakil et al. |
| 5,902,763 A | 5/1999 | Waku et al. |
| 5,904,800 A | 5/1999 | Mautz |
| 5,942,039 A | 8/1999 | Kholodenko et al. |

(Continued)

FOREIGN PATENT DOCUMENTS

| | | |
|---|---|---|
| CN | 1412150 | 4/2003 |
| CN | 1699279 | 11/2005 |

(Continued)

OTHER PUBLICATIONS

Suzuki, "Phase transition temperature of fluorite-type ZrO2—Y2O," Solid State Ionics, pp. 211-216, 1995, 6 pages.

(Continued)

*Primary Examiner* — Karl E Group
(74) *Attorney, Agent, or Firm* — Lowenstein Sandler LLP

(57) ABSTRACT

Disclosed herein is a ceramic article or coating useful in semiconductor processing, which is resistant to erosion by halogen-containing plasmas. The ceramic article or coating is formed from a combination of yttrium oxide and zirconium oxide.

10 Claims, 6 Drawing Sheets

(56) References Cited

U.S. PATENT DOCUMENTS

| | | | |
|---|---|---|---|
| 5,986,338 A | 11/1999 | Nakajima | |
| 5,993,594 A | 11/1999 | Wicker et al. | |
| 5,993,976 A | 11/1999 | Sahoo et al. | |
| 6,027,629 A | 2/2000 | Hisamoto et al. | |
| 6,027,792 A | 2/2000 | Yamamoto et al. | |
| 6,069,103 A | 5/2000 | Kwon | |
| 6,100,633 A | 8/2000 | Okumura et al. | |
| 6,123,791 A | 9/2000 | Han et al. | |
| 6,143,432 A | 11/2000 | de Rochemont et al. | |
| 6,153,270 A | 11/2000 | Russmann et al. | |
| 6,170,429 B1 | 1/2001 | Schoepp et al. | |
| 6,183,897 B1 | 2/2001 | Hartvigsen et al. | |
| 6,237,528 B1 | 5/2001 | Szapucki et al. | |
| 6,352,611 B1 | 3/2002 | Han et al. | |
| 6,383,964 B1 | 5/2002 | Nakahara et al. | |
| 6,399,499 B1 | 6/2002 | Lee | |
| 6,408,786 B1 | 6/2002 | Kennedy et al. | |
| 6,447,937 B1 | 9/2002 | Murakawa et al. | |
| 6,492,042 B2 | 12/2002 | Morita et al. | |
| 6,521,046 B2 | 2/2003 | Tanaka et al. | |
| 6,547,978 B2 | 4/2003 | Ye et al. | |
| 6,548,424 B2 | 4/2003 | Putkonen | |
| 6,565,984 B1 | 5/2003 | Wu et al. | |
| 6,592,707 B2 | 7/2003 | Shih et al. | |
| 6,620,520 B2 | 9/2003 | O'Donnell et al. | |
| 6,641,697 B2 | 11/2003 | Han et al. | |
| 6,641,941 B2 | 11/2003 | Yamada et al. | |
| 6,645,585 B2 | 11/2003 | Ozono | |
| 6,682,627 B2 | 1/2004 | Shamouilian et al. | |
| 6,730,422 B2 | 5/2004 | Litton et al. | |
| 6,773,751 B2 | 8/2004 | O'Donnell et al. | |
| 6,776,873 B1 | 8/2004 | Sun et al. | |
| 6,777,353 B2 | 8/2004 | Putkonen | |
| 6,777,873 B2 | 8/2004 | Hashikawa | |
| 6,780,787 B2 | 8/2004 | O'Donnell et al. | |
| 6,783,863 B2 | 8/2004 | Harada et al. | |
| 6,783,875 B2 | 8/2004 | Yamada et al. | |
| 6,805,952 B2 | 10/2004 | Chang et al. | |
| 6,830,622 B2 | 12/2004 | O'Donnell et al. | |
| 6,858,332 B2 | 2/2005 | Yamada | |
| 6,858,546 B2 | 2/2005 | Niinisto et al. | |
| 6,884,516 B2 | 4/2005 | Harada et al. | |
| 6,916,559 B2 | 7/2005 | Murakawa et al. | |
| 6,933,254 B2 | 8/2005 | Morita et al. | |
| 6,942,929 B2 | 9/2005 | Han et al. | |
| 6,983,892 B2 | 1/2006 | Noorbakhsh et al. | |
| 7,101,819 B2 | 9/2006 | Rosenflanz et al. | |
| 7,137,353 B2 | 11/2006 | Saigusa et al. | |
| 7,147,544 B2 | 12/2006 | Rosenflanz | |
| 7,147,749 B2 | 12/2006 | Nishimoto et al. | |
| 7,148,167 B2 | 12/2006 | Shikata et al. | |
| 7,163,585 B2 | 1/2007 | Nishimoto et al. | |
| 7,166,166 B2 | 1/2007 | Saigusa et al. | |
| 7,166,200 B2 | 1/2007 | Saigusa et al. | |
| 7,168,267 B2 | 1/2007 | Rosenflanz et al. | |
| 7,186,466 B2 | 3/2007 | Zhu et al. | |
| 7,220,497 B2 | 5/2007 | Chang | |
| 7,226,673 B2 | 6/2007 | Yamada et al. | |
| 7,255,898 B2 | 8/2007 | O'Donnell et al. | |
| 7,291,408 B2 | 11/2007 | Litton et al. | |
| 7,351,658 B2 | 4/2008 | Putkonen | |
| 7,429,350 B2 | 9/2008 | Saint-Ramond et al. | |
| 7,479,304 B2 | 1/2009 | Sun et al. | |
| 7,494,723 B2 | 2/2009 | Harada et al. | |
| 7,498,272 B2 | 3/2009 | Niinisto et al. | |
| 7,501,000 B2 | 3/2009 | Rosenflanz et al. | |
| 7,501,001 B2 | 3/2009 | Rosenflanz et al. | |
| 7,510,585 B2 | 3/2009 | Rosenflanz | |
| 7,608,553 B2 | 10/2009 | Fujita et al. | |
| 7,696,117 B2 | 4/2010 | Sun et al. | |
| 7,862,901 B2 | 1/2011 | Darolia et al. | |
| 8,016,948 B2 | 9/2011 | Wang et al. | |
| 8,021,762 B2 | 9/2011 | Taylor et al. | |
| 8,034,734 B2 | 10/2011 | Sun et al. | |
| 8,067,067 B2 | 11/2011 | Sun et al. | |
| 8,367,227 B2 | 2/2013 | Sun et al. | |
| 8,623,527 B2 | 1/2014 | Sun et al. | |
| 8,728,967 B2 | 5/2014 | Taylor et al. | |
| 8,871,312 B2 * | 10/2014 | Sun | C04B 35/486 427/180 |
| 9,051,219 B2 | 6/2015 | Sun et al. | |
| 9,440,886 B2 | 9/2016 | Sun | |
| 9,616,559 B2 | 4/2017 | Slack | |
| 9,884,787 B2 | 2/2018 | Sun | |
| 2001/0003271 A1 | 6/2001 | Otsuki | |
| 2002/0009560 A1 | 1/2002 | Ozono | |
| 2002/0015853 A1 | 2/2002 | Wataya et al. | |
| 2002/0018921 A1 | 2/2002 | Yamada et al. | |
| 2002/0086118 A1 | 7/2002 | Chang et al. | |
| 2002/0110698 A1 | 8/2002 | Singh | |
| 2002/0127853 A1 | 9/2002 | Hubacek et al. | |
| 2002/0142611 A1 | 10/2002 | O'Donnell et al. | |
| 2002/0177001 A1 | 11/2002 | Harada et al. | |
| 2002/0190652 A1 | 12/2002 | Do et al. | |
| 2003/0010446 A1 | 1/2003 | Kajiyama et al. | |
| 2003/0027049 A1 | 2/2003 | Barker et al. | |
| 2003/0029563 A1 | 2/2003 | Kaushal et al. | |
| 2003/0034130 A1 | 2/2003 | Fujita et al. | |
| 2003/0051811 A1 | 3/2003 | Uchimaru et al. | |
| 2003/0075109 A1 | 4/2003 | Arai | |
| 2003/0110708 A1 | 6/2003 | Rosenflanz | |
| 2003/0127049 A1 | 7/2003 | Han et al. | |
| 2003/0134134 A1 | 7/2003 | Simpson et al. | |
| 2003/0152813 A1 | 8/2003 | Paz de Araujo et al. | |
| 2003/0203120 A1 | 10/2003 | Tsukatani et al. | |
| 2003/0215643 A1 | 11/2003 | Morita et al. | |
| 2003/0215665 A1 | 11/2003 | Bruce et al. | |
| 2003/0215996 A1 | 11/2003 | Putkonen | |
| 2004/0002221 A1 | 1/2004 | O'Donnell et al. | |
| 2004/0023047 A1 | 2/2004 | O'Donnell et al. | |
| 2004/0038085 A1 | 2/2004 | Litton et al. | |
| 2004/0038086 A1 | 2/2004 | Litton et al. | |
| 2004/0060657 A1 | 4/2004 | Saigusa et al. | |
| 2004/0067392 A1 | 4/2004 | Yamada et al. | |
| 2004/0149210 A1 | 8/2004 | Fink | |
| 2004/0159984 A1 | 8/2004 | Isomura et al. | |
| 2004/0191545 A1 | 9/2004 | Han et al. | |
| 2004/0216667 A1 | 11/2004 | Mitsuhashi et al. | |
| 2004/0229078 A1 | 11/2004 | Maeda | |
| 2004/0245089 A1 | 12/2004 | Lawson | |
| 2004/0245098 A1 | 12/2004 | Eckerson | |
| 2005/0003240 A1 | 1/2005 | O'Donnell | |
| 2005/0037193 A1 | 2/2005 | Sun et al. | |
| 2005/0056218 A1 | 3/2005 | Sun et al. | |
| 2005/0065012 A1 | 3/2005 | Rosenflanz et al. | |
| 2005/0123288 A1 | 6/2005 | Ito et al. | |
| 2005/0161061 A1 | 7/2005 | Shih et al. | |
| 2005/0215059 A1 | 9/2005 | Davis et al. | |
| 2005/0227118 A1 | 10/2005 | Uchimaru et al. | |
| 2005/0274320 A1 | 12/2005 | Murugesh et al. | |
| 2005/0279457 A1 | 12/2005 | Matsudo et al. | |
| 2006/0037536 A1 | 2/2006 | Kobayashi et al. | |
| 2006/0040508 A1 | 2/2006 | Ji et al. | |
| 2006/0042754 A1 | 2/2006 | Yoshida et al. | |
| 2006/0043067 A1 | 3/2006 | Kadkhodayan et al. | |
| 2006/0073354 A1 | 4/2006 | Watanabe et al. | |
| 2007/0032072 A1 | 2/2007 | Sidhwa | |
| 2007/0109713 A1 | 5/2007 | Miyaji et al. | |
| 2007/0134416 A1 | 6/2007 | Wang et al. | |
| 2007/0151581 A1 | 7/2007 | Wang et al. | |
| 2007/0197368 A1 | 8/2007 | Ysukuma et al. | |
| 2007/0237971 A1 | 10/2007 | Saint-Ramond et al. | |
| 2007/0274837 A1 | 11/2007 | Taylor et al. | |
| 2008/0026160 A1 | 1/2008 | Taylor et al. | |
| 2008/0029032 A1 | 2/2008 | Sun et al. | |
| 2008/0160172 A1 | 7/2008 | Taylor et al. | |
| 2008/0213496 A1 | 9/2008 | Sun et al. | |
| 2008/0213617 A1 | 9/2008 | Taylor et al. | |
| 2008/0220209 A1 | 9/2008 | Taylor et al. | |
| 2008/0237543 A1 | 10/2008 | Kobayashi et al. | |
| 2008/0264564 A1 | 10/2008 | Sun et al. | |
| 2008/0264565 A1 | 10/2008 | Sun et al. | |
| 2009/0025751 A1 | 1/2009 | Wang et al. | |
| 2009/0036292 A1 | 2/2009 | Sun et al. | |

(56) References Cited

U.S. PATENT DOCUMENTS

| | | |
|---|---|---|
| 2009/0087615 A1 | 4/2009 | Sun et al. |
| 2009/0108507 A1 | 4/2009 | Messing et al. |
| 2009/0214825 A1 | 8/2009 | Sun et al. |
| 2010/0160143 A1 | 6/2010 | Sun et al. |
| 2010/0272982 A1 | 10/2010 | Dickinson et al. |
| 2011/0036874 A1 | 2/2011 | Wang et al. |
| 2011/0110293 A1 | 5/2011 | Hart et al. |
| 2012/0003102 A1 | 1/2012 | Taylor et al. |
| 2012/0034469 A1 | 2/2012 | Sun et al. |
| 2012/0035046 A1 | 2/2012 | Rosenflanz |
| 2012/0122651 A1 | 5/2012 | Taylor et al. |
| 2013/0224498 A1 | 8/2013 | Sun et al. |
| 2013/0295326 A1 | 11/2013 | Doesburg et al. |
| 2013/0330507 A1 | 12/2013 | Taylor et al. |
| 2014/0178632 A1 | 6/2014 | Taylor et al. |
| 2014/0334939 A1 | 11/2014 | Taylor et al. |
| 2015/0056218 A1 | 2/2015 | Jeffries et al. |
| 2015/0143677 A1 | 5/2015 | Sun et al. |
| 2016/0326060 A1 | 11/2016 | Sun |
| 2018/0044246 A1 | 2/2018 | Sun |

FOREIGN PATENT DOCUMENTS

| | | |
|---|---|---|
| DE | 19955134 | 5/2001 |
| EP | 0293198 | 11/1988 |
| EP | 1088803 | 4/2001 |
| EP | 1158072 | 11/2001 |
| EP | 1310466 | 5/2003 |
| JP | S61031352 | 2/1986 |
| JP | H03287797 | 12/1991 |
| JP | 06065706 | 3/1994 |
| JP | H11251304 | 9/1999 |
| JP | 2000001362 | 1/2000 |
| JP | 2000012666 | 1/2000 |
| JP | 2001023908 | 1/2001 |
| JP | 2001049419 | 2/2001 |
| JP | 2001089229 | 4/2001 |
| JP | 2001179080 | 7/2001 |
| JP | 2001181042 | 7/2001 |
| JP | 2001203256 | 7/2001 |
| JP | 2001244246 | 9/2001 |
| JP | 2001308011 | 11/2001 |
| JP | 2001322871 | 11/2001 |
| JP | 2002080270 | 3/2002 |
| JP | 2002087878 | 3/2002 |
| JP | 2002249864 | 9/2002 |
| JP | 2002255647 | 9/2002 |
| JP | 2003146751 | 5/2003 |
| JP | 2003238250 | 8/2003 |
| JP | 2003282688 | 10/2003 |
| JP | 2004269951 | 9/2004 |
| JP | 2004292270 | 10/2004 |
| JP | 2005206421 | 8/2005 |
| JP | 2005335991 | 12/2005 |
| JP | 2006089338 | 4/2006 |
| JP | 2006097114 | 4/2006 |
| JP | 2007145702 | 6/2007 |
| KR | 1020040048343 | 6/2004 |
| KR | 20070021061 | 2/2007 |
| SU | 381643 | 5/1973 |
| SU | 722715 | 3/1980 |
| WO | 2004003968 | 1/2004 |
| WO | 2007008999 | 1/2007 |
| WO | 2009017766 | 2/2009 |

OTHER PUBLICATIONS

Office Action for Japanese Patent Application No. 2018-217295 dated Jun. 25, 2019, 8 pages.
"Plasma Spray" SemiCon Precision Industries Inc. 2005, Jun. 16, 2007, http://www.semiconprecision.com/plasma.htm.
"Surface Preparation" SemiCon Precision Industries Inc. 2005, Jun. 16, 2007, http://www.semiconprecision.com/surface_prep.htm.
European Search Report of corresponding EP Application Patent Application No. 08154940.4 Oct. 2010.
International Search Report and Written Opinion of International Patent Application No. PCT/US08/09221 dated Nov. 18, 2008.

* cited by examiner

100Y2O3-20ZrO2-10Al2O3 BEFORE EROSION 2K

100Y2O3-20ZrO2-10Al2O3 AFTER EROSION 2K

COATED ARTICLE AND SEMICONDUCTOR CHAMBER APPARATUS FORMED FROM YTTRIUM OXIDE AND ZIRCONIUM OXIDE

CROSS-REFERENCE TO RELATED APPLICATIONS

The present application is a continuation application of U.S. patent application Ser. No. 13/998,723, filed Nov. 26, 2013, which is a divisional application of U.S. patent application Ser. No. 13/986,040, filed Mar. 25, 2013, which is a continuation application of U.S. patent application Ser. No. 13/199,521, filed Aug. 31, 2011, which is a divisional application of U.S. patent application Ser. No. 12/660,068, filed Feb. 19, 2010, which is a continuation of U.S. patent application Ser. No. 11/796,210, filed Apr. 27, 2007, the disclosures of which are hereby incorporated by reference herein in their entireties.

The present application is also related to a series of applications filed by various inventors of the present application, many of which relate to the use of a yttrium-oxide comprising ceramic in the form of a coating, to provide a plasma-resistant surface which is useful in semiconductor processing applications. The applications include U.S. patent application Ser. No. 10/075,967 of Sun et al., filed Feb. 14, 2002, entitled: "Yttrium Oxide Based Surface Coating for Semiconductor IC Processing Vacuum Chambers;" U.S. patent application Ser. No. 10/898,113 of Sun et al., filed Jul. 22, 2004, entitled: "Clean, Dense Yttrium Oxide Coating Protecting Semiconductor Processing Apparatus;" and U.S. patent application Ser. No. 10/918,232, of Sun et al., filed Aug. 13, 2004, entitled: "Gas Distribution Plate Fabricated from a Solid Yttrium Oxide-Comprising Substrate." Additional related applications filed, which are a divisional and a continuation application of above-listed applications, include: U.S. patent application Ser. No. 11/595,484 of Wang et al., filed Nov. 10, 2006, entitled: "Cleaning Method Used in Removing Contaminants from the Surface of an Oxide or Fluoride Comprising a Group III Metal," which is a divisional application of U.S. patent application Ser. No. 10/898,113; and U.S. patent application Ser. No. 11/592,905 of Wang et al., filed Nov. 3, 2006, entitled: "Cleaning Method Used in Removing Contaminants from a Solid Yttrium Oxide-Containing Substrate," which is a continuation application of U.S. patent application Ser. No. 10/918, 232. The subject matter of all of these patents and applications is hereby incorporated by reference herein in its entirety.

FIELD OF THE PRESENT INVENTION

The present invention relates to a specialized yttrium oxide comprising solid solution ceramic which is highly resistant to plasmas in general, particularly resistant to corrosive plasmas of the kind used in the etching of semiconductor substrates.

BACKGROUND

This section describes background subject matter related to the disclosed embodiments of the present invention. There is no intention, either express or implied, that the background art discussed in this section legally constitutes prior art.

Corrosion (including erosion) resistance is a critical property for apparatus components and liners used in semiconductor processing chambers, where corrosive environments are present. Example of corrosive plasma environments include plasmas used for cleaning of processing apparatus and plasmas used to etch semiconductor substrates. Plasmas used for plasma-enhanced chemical vapor deposition processes often tend to be corrosive as well. This is especially true where high-energy plasma is present and combined with chemical reactivity to act upon the surface of components present in the environment. The reduced chemical reactivity of an apparatus component surface or of a liner surface is also an important property when corrosive gases alone are in contact with processing apparatus surfaces.

Process chambers and component apparatus present within processing chambers which are used in the fabrication of electronic devices and micro-electro-mechanical structures (MEMS) are frequently constructed from aluminum and aluminum alloys. Surfaces of a process chamber and component apparatus present within the chamber are frequently anodized to provide a degree of protection from the corrosive environment. However, the integrity of the anodization layer may be deteriorated by impurities in the aluminum or aluminum alloy, so that corrosion begins to occur early, shortening the life span of the protective coating. Ceramic coatings of various compositions have been used in place of the aluminum oxide layer mentioned above, and have been used over the surface of the anodized layer to improve the protection of the underlying aluminum-based materials. However, current materials used for protective layers deteriorate over time and eventually leave the aluminum alloy subject to attack by the plasma, even though the life span of the protective layer is extended over that of anodized aluminum.

Yttrium oxide is a ceramic material which has shown considerable promise in the protection of aluminum and aluminum alloy surfaces which are exposed to fluorine-containing plasmas of the kind used in the fabrication of semiconductor devices. A yttrium oxide coating has been used and applied over an anodized surface of a high purity aluminum alloy process chamber surface, or a process component surface, to produce excellent corrosion protection (e.g. U.S. Pat. No. 6,776,873, mentioned above). In one application, the '873 Patent provides a processing chamber component resistant to a plasma including fluorine and oxygen species. The processing chamber component typically comprises: a high purity aluminum substrate, where particulates formed from mobile impurities present in the aluminum are carefully controlled to have a particular size distribution; an anodized coating on a surface of the high purity aluminum substrate; and, a protective coating comprising yttrium oxide overlying the anodized coating. The protective coating may include aluminum oxide up to about 10% by weight, and typically comprises 99.95% by weight or greater yttrium oxide. The protective coating is typically applied using a method such as spray coating, chemical vapor deposition, or physical vapor deposition.

U.S. Pat. No. 5,798,016 describes the use of aluminum oxide as a coating layer for chamber walls or as a coating layer for a chamber liner. The '016 Patent further discloses that since aluminum is reactive with a number of plasmas, it is recommended that aluminum oxide or a coating thereof be disposed on the liner or chamber walls because aluminum oxide tends to be chemically inert. In addition, a protective coating may be applied over the surfaces of the liner and/or chamber walls. Examples which are given include $Al_2O_3$, $Sc_2O_3$, or $Y_2O_3$.

U.S. Patent Application Publication No. 2001/0003271 A1 discloses a film of $Al_2O_3$, or $Al_2O_3$ and $Y_2O_3$, formed on an inner wall surface of the chamber and on those exposed surfaces of the members within the chamber which require a high corrosion resistance and insulating property. An example is given of a processing chamber where a base material of the chamber may be a ceramic material ($Al_2O_3$, $SiO_2$, AlN, etc.), aluminum, or stainless steel, or other metal or metal alloy, which has a sprayed film over the base material. The film may be made of a compound of a III-B element of the periodic table, such as $Y_2O_3$. The film may substantially comprise $Al_2O_3$ and $Y_2O_3$. A sprayed film of yttrium-aluminum-garnet (YAG) is also mentioned. The sprayed film thickness is said to range from 50 μm to 300 μm.

In another application, a ceramic composition of matter comprising a ceramic compound (e.g. $Al_2O_3$) and an oxide of a Group IIIB metal (e.g. $Y_2O_3$) has been used for a dielectric window of a reactor chamber where substrates are processed in a plasma of a processing gas (e.g. U.S. Pat. No. 6,352,611). The ceramic compound may be selected from silicon carbide, silicon nitride, boron carbide, boron nitride, aluminum nitride, aluminum oxide, and mixtures thereof; however, aluminum oxide is said to be available in a pure form which does not outgas. The Group IIIB metal may be selected from the group consisting of scandium, yttrium, the cerium subgroup, and the yttrium subgroup; however, yttrium is preferred, with the oxide being yttrium oxide. The preferred process for forming or producing the dielectric member is by thermal processing of a powdered raw mixture comprising the ceramic compound, the oxide of a Group IIIB metal, a suitable additive agent, and a suitable binder agent.

In another application, a protective coating for a semiconductor processing apparatus component is described. The protective coating comprises aluminum or an aluminum alloy, where the coating includes a material selected from, for example, but not limited to: yttrium-aluminum-garnet (YAG); an oxide of an element selected from the group consisting of Y, Sc, La, Ce, Eu, and Dy; a fluoride of an element selected from the group consisting of Y, Sc, La, Ce, Eu, and Dy; and combinations thereof is used (e.g. U.S. patent application Ser. No. 10/898,113 of Sun et al., filed Jul. 22, 2004, mentioned above). The coating is applied to a substrate surface by thermal/flame spraying, plasma spraying, sputtering, or chemical vapor deposition (CVD). The coating is placed in compression by applying the coating at a substrate surface temperature of at least about 150-200° C.

The kinds of protective coatings described above have been used to protect exposed surfaces of a plasma source gas distribution plate of the kind used in semiconductor and MEMS processing apparatuses. However, due to the concentration of reactive species which are present at the surface of the gas distribution plate, the lifetime of the gas distribution plate has typically been limited, from about 8 processing days to about 80 processing days, depending on the corrosivity of the plasma created in the processing chamber. To increase the lifetime of a component such as a gas distribution plate, a gas distribution plate was fabricated from a solid yttrium oxide-comprising substrate, as described in U.S. patent application Ser. No. 10/918,232 of Sun et al., mentioned above. The solid yttrium oxide-comprising substrate contains up to about 10% aluminum oxide in some instances. The solid yttrium oxide-comprising substrate typically comprises about 99.99% yttrium oxide.

As device geometry continues to shrink, the on-wafer defect requirements become more stringent, as particulate generation from apparatus within the processing chamber increases in importance. For plasma dry etch chambers running various halogen, oxygen, and nitrogen chemistries, such as F, Cl, Br, O, N, and various combinations thereof, for example, the selection of the material used for apparatus components and chamber liners becomes more critical. The materials with good plasma resistance performance (which also have adequate mechanical, electrical and thermal properties), can reduce particle generation, metal contamination, and provide prolonged component life. This translates to low costs of manufacturing, reduced wafer defects, increased lifetime, and increased mean time between cleaning. Ceramic materials which have been used in such applications include $Al_2O_3$, AlN, and SiC. However, the plasma resistance properties of these ceramic materials is not adequate in many instances, particularly when a fluorine plasma source gas is involved. The recent introduction of $Y_2O_3$ ceramic shows improved plasma resistance properties, but this material generally exhibits weak mechanical properties that limits its applications for general use in semiconductor processing components, processing kits, and chamber liners.

SUMMARY

Semiconductor processing conditions expose semiconductor processing apparatus, such as the interior of processing chambers and the surfaces of components within the processing chambers, to a variety of chemical reagents and plasma ions which attack processing apparatus surfaces. The effect of the attack on an apparatus surface is frequently referred to as erosion of the apparatus surface. It is possible to reduce the erosion rate by selecting a particular material composition for the apparatus surfaces. A protective material may be applied as a coating over the apparatus surface; however, this may not be the best solution to avoiding erosion. The coating is constantly getting thinner (eroding) during a plasma etch, and there is an increased risk that the substrate beneath the coating will be attacked by the plasma penetrating the coating layer. The coating layer may flake off during plasma processing due to residual stress. While such problems will be significantly reduced by using a coating of the erosion-resistant materials described in embodiments herein, in many instances it may be advantageous to form an entire apparatus component from the erosion-resistant materials. However, frequently the materials which are more erosion-resistant are more crystalline, and an improvement in erosion resistance comes at a cost, in the form of decreased mechanical properties (such as ductility) of the apparatus. Ceramic materials which are formed from an oxide of a Group IIIA, IIIB, IVB and VB element, or combinations thereof, have been demonstrated to provide erosion resistance to halogen-comprising plasmas. Embodiments of the present invention pertain to reducing the erosion rate of a ceramic material, typically comprising a Group IIIA, IIIB, IVB, or a Group VB element, or combinations thereof, while maintaining acceptable mechanical properties or improving mechanical properties of the component parts made of the ceramic material.

In one embodiment, sintered ceramics are formed which contain a single solid solution phase or which are multi-phase, such as two phase and three phase. The multi-phase ceramics typically contain a yttrium aluminate phase and one or two solid solution phases formed from yttrium oxide, zirconium oxide and/or rare earth oxides. The sintered ceramic has been evaluated under various plasma processing conditions to determine erosion resistance. The materials which were erosion tested were also tested for mechanical properties. For example, ceramic materials formed from starting compositions in which the $Y_2O_3$, yttrium oxide, molar concentration ranges from about 50 mole % to about 75 mole %; the $ZrO_2$, zirconium oxide, molar concentration ranges from about 10 mole % to about 30 mole %; and, the $Al_2O_3$, aluminum oxide, molar concentration ranges from about 10 mole % to about 30 mole % provide excellent erosion resistance to halogen-containing plasmas while providing advanced mechanical properties which enable handling of solid ceramic processing components with less concern about damage to a component. In many embodiments, a starting composition for the ceramic materials may be one that comprises $Y_2O_3$ molar concentration ranges from about 55 mole % to about 65 mole %, $ZrO_2$ molar concentration ranges from about 15 mole % to about 25 mole %, and $Al_2O_3$ molar concentration ranges from about 10 mole % to about 25 mole %. When the erosion rate is of great concern, the starting material concentration of the ceramic material may be one that comprises $Y_2O_3$ molar concentration ranges from about 55 mole % to about 65 mole %, the $ZrO_2$ molar concentration ranges from about 20 mole % to about 25 mole % and the $Al_2O_3$ molar concentration 10 mole % to about 15 mole %. In one embodiment, to produce a solid apparatus component, these starting material formulations are compacted into a pelletized form and are sintered using a method selected from pressureless sintering, hot-press sintering (HP), or hot isostatic press sintering (HIP). These sintering techniques are well known in the art.

In other embodiments, the starting material compositions listed above may be used to form a ceramic coating over the surface of a variety of metal and ceramic substrates, including, but not limited to, aluminum, aluminum alloy, stainless steel, alumina, aluminum nitride and quartz, using a technique well known in the art, such as plasma spraying, for example and not by way of limitation. Typically the aluminum alloy used is a high purity aluminum alloy of the kind described in U.S. Pat. No. 6,776,873, mentioned above. However, with the improved mechanical properties which have been obtained, it is recommended that solid ceramic apparatus components be used when possible, to avoid the eventual failure of the apparatus to function properly due to interfacial problems between the coating and the underlying substrate, or to prevent a sudden failure of plasma resistance due to the coating layer flaking off, or to prevent plasma penetration of the coating layer through defects which may be exposed from within the coating layer as the coating layer becomes thinner due to erosion.

The addition of zirconium oxide powder to yttrium oxide powder at a concentration of zirconium oxide, ranging from about 0.1 mole % to about 65 mole %, after consolidation by conventional ceramic processing, provides a single solid solution with a cubic yttria crystal structure phase or a cubic fluorite-type crystal structure phase, or provides a mixed solid solution of cubic yttria crystal structure phase and cubic fluorite-type crystal structure phase. For the cubic yttria crystal structure, the cell parameter of the solid solution is smaller than that of the pure cubic yttrium oxide crystalline structure, due to the formation of yttrium vacancy. For the cubic fluorite-type crystal structure, the cell parameter of the solid solution is smaller than that of the pure cubic fluorite-type structure, due to the formation of oxygen vacancy. The smaller cell parameter improves the plasma resistance properties of the solid solution of zirconium oxide in yttrium oxide. For example, the erosion rate of a pure solid yttrium oxide ceramic in a $CF_4/CHF_3$ plasma is about 0.3 µm/hr. The erosion rate (the rate at which a surface is removed in µm (of thickness)/hr) of a solid ceramic of about 69 mole % yttrium oxide and about 31 mole % zirconium oxide is about 0.1 µm/hr, a 3 times slower erosion rate than pure solid yttrium oxide. This unexpected decrease in erosion rate extends the lifetime of a process chamber liner or an internal apparatus component within the process chamber, so that the replacement frequency for such apparatus is reduced, reducing apparatus down time; and, the particle and metal contamination level generated during a plasma process is reduced, enabling a device fabrication with ever shrinking geometry with reduced overall cost of the processing apparatus per wafer processed, on the average.

While the 0.1 µm/hr erosion rate for the zirconium oxide-containing yttrium oxide solid solution is surprisingly better than that of yttrium oxide at 0.3 µm/hr, and considerably better than of a solid aluminum oxide ceramic at 1.44 µm/hr in the $CF_4/CHF_3$ plasma, the mechanical properties of the zirconium oxide-containing yttrium oxide solid solution illustrate that an improvement in flexural strength and fracture toughness would be helpful.

In one embodiment, the flexural strength and fracture toughness of the zirconium oxide-containing yttrium oxide solid solution are achieved, by adding various amounts of aluminum oxide to the formula for the solid solution ceramic to form an additional yttrium aluminate phase. The mixture of oxides was pelletized by unidirectional mechanical pressing or cold isostatic pressing of a granular powder formed by spray drying, in combination with a typical content of binders. The green body was then pressureless sintered using techniques generally known in the art. The addition of 10 mole % to 30 mole % of alumina significantly improved the mechanical properties of the sintered ceramic composition in terms of flexural strength and fracture toughness, as discussed subsequently herein. This surprising change in mechanical properties, which indicates that fabricated parts could be handled with less risk of fracture, was achieved with minimal effect on the plasma erosion rate of the ceramic material. For example, the erosion rate of the ceramic containing 69 mole % yttrium oxide and 31 mole % zirconium oxide, after exposure to a plasma containing $CF_4$ and $CHF_3$, was about 0.1 µm/hr. For the ceramic containing about 14 mole % aluminum oxide, the erosion rate after exposure to the same plasma was also about 0.1 µm/hr. For the ceramic containing about 25 mole % aluminum oxide, the erosion rate after exposure to the same plasma was about 0.22 µm/hr. The relationship between aluminum oxide content, increase in flexural strength, and increase in erosion rate is not a linear relationship. However, one of skill in the art can optimize the formula with minimal experimentation, in view of the information provided herein.

As an alternative to adding aluminum oxide to a multi-phase metal stable composition containing yttrium oxide and zirconium oxide, it is possible to add $HfO_2$, hafnium oxide; $Sc_2O_3$, scandium oxide; $Nd_2O_3$, neodymium oxide; $Nb_2O_5$, niobium oxide; $Sm_2O_3$, samarium oxide; $Yb_2O_3$, ytterbium oxide; $Er_2O_3$, erbium oxide; $Ce_2O_3$ (or $CeO_2$), cerium oxide, or combinations thereof. In the instance where one of these alternative oxides is used, the concentration of the oxide in the starting material formulation ranges from about 0.1 mole % to about 90 mole %, and typically ranges from about 10 mole % to about 30 mole %.

After mixing of at least one of the alternative oxides listed above with the $Y_2O_3$ and $ZrO_2$ powders used to form a solid solution, the combination of powders was compacted by unidirectionally mechanical pressing or cold isostatic pressing of the granular powder formed by spray drying with a typical content of binders. The green body was then pressureless sintered using techniques known in the art. Upon cooling of the sintered body, a single phase or two phase solid solution forms, where the solid solution is a "multi-element-doped" solid solution. One solid solution exhibits a cubic yttria crystal structure, and another solid solution exhibits the cubic fluorite-type crystal structure. The solid solution has excellent plasma resistance, typically better erosion resistance than that of the aluminum oxide-comprising solid solutions discussed herein. However, the mechanical properties of the yttria-zirconia-alumina system are somewhat better. All of these multi-doped solid solutions exhibit excellent plasma erosion resistance and improved mechanical properties in comparison with previously known yttrium oxide-zirconium oxide solid solutions.

DETAILED DESCRIPTION OF EXEMPLARY EMBODIMENTS

Figure 1A:
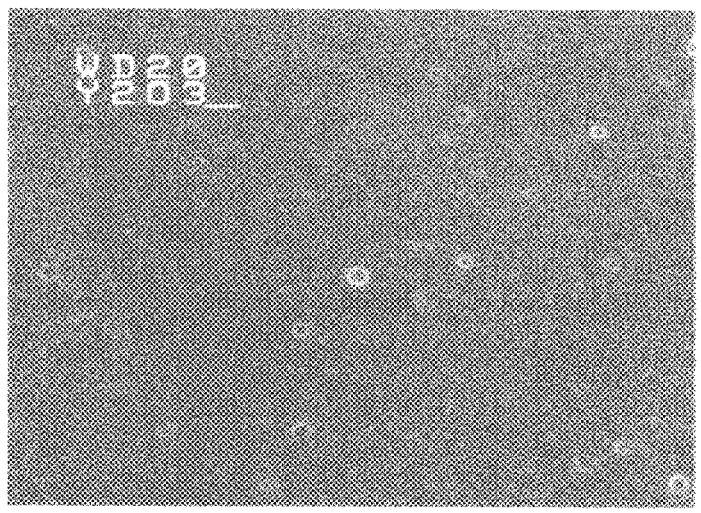
FIG. 1A shows a photomicrograph of the as-sintered surface of a solid yttrium oxide ceramic at a magnification of 1,000 times.

As a preface to the detailed description, it should be noted that, as used in this specification and the appended claims, the singular forms "a," "an," and "the" include plural referents, unless the context clearly dictates otherwise.

When the word "about" is used herein, this is intended to mean that the nominal value presented is precise within ±10%.

Bulk yttrium oxide has been shown to have very good corrosion resistance upon exposure to fluorine plasma and other corrosive plasmas which are typically used in semiconductor manufacturing processes (such as etch processes and chemical vapor deposition processes). However, pure crystalline yttrium oxide, while offering very good corrosion resistance to various etchant plasmas, does not offer good mechanical properties in terms of flexural strength and fracture toughness, for example. To improve the overall performance and handling capabilities of semiconductor component parts and liners, there is a need to improve the mechanical properties from those available in pure crystalline yttrium oxide. To obtain the improvement in mechanical properties, it is necessary to form an alloy of yttrium oxide with a compatible oxide. The improvement in mechanical properties is needed to be accomplished without harming the very good plasma erosion properties of the pure yttrium oxide.

In consideration of the Gibbs Formation Free Energy of various ceramic materials which might be compatible with yttrium oxide, we determined that it is more difficult to form fluorides than oxides for yttrium and aluminum elements, so that yttrium oxide and aluminum oxide are expected to provide good resistance to a fluorine-containing plasma. The Gibbs Formation Free Energy of zirconium fluoride is similar to that for yttrium fluoride. Further, in a homogeneous amorphous oxyfluoride, or a glass-ceramic composite oxyfluoride, increasing the zirconium fluoride content can decrease the free energy of the final oxyfluoride to make it more stable.

EXAMPLE EMBODIMENTS

Example One

Etch Plasma Process Conditions for Erosion Rate Testing

Tables One-Three, below, provides the etch plasma compositions and etch plasma processing conditions which were used for evaluation of a series of test coupon materials. There were three basic different sets of etch plasma conditions which were used for the erosion rate testing: 1) Trench etching, where the etch plasma source gas and etch process conditions were representative of etching a trench feature size beyond 65 nm technology, i.e. smaller than 65 nm, into a multilayered semiconductor substrate. Such a substrate typically includes an antireflective coating (ARC or BARC) layer, an organic or inorganic dielectric layer, a metal layer, and an etch stop layer. Contact Via etching, where the etch plasma source gas and etch process conditions were representative of etching a contact via having an aspect ratio of about 30 in production and 40 plus in the developed device substrate, and having a diameter of beyond 65 nm technology into a multilayered semiconductor substrate including a buried ARC (BARC) layer, a dielectric layer and a stop layer; and 3) Metal etching, here the etch plasma source gas and etch process conditions were representative of etching an overlying titanium nitride hard mask and an aluminum layer, where the etch plasma source gas and etch process conditions are beyond 65 nm technology.

The trench etching process and the contact via etching process were carried out in the ENABLER™ processing system, and the metal etching process was carried out in the DPS™ processing system, all available from Applied Materials, Inc. of Santa Clara, Calif.

TABLE ONE

Process Conditions for Trench Etch Erosion Rate Test

| Trench Etch Simulation | $CF_4$* | $O_2$* | $CHF_3$* | $N_2$* | Ar* | Plasma Source Power[1] | Pr[2] | Subr Bias Power[3] | Subr Temp[4] | Time[5] |
|---|---|---|---|---|---|---|---|---|---|---|
| Etch Step One | 150 | | 30 | | | | 300 | 1,000 | 40 | 35 |
| Etch Step Two | | | | 400 | | 1200 | 220 | 400 | 40 | 40 |
| Etch Step Three | 175 | | 15 | | | 1500 | 150 | 500 | 40 | 39 |
| Etch Step Four | | 500 | | | | 100 | 10 | 200 | 40 | 55 |

*All gas flow rates are in sccm.
[1]Plasma Source Power in W.
[2]Pressure in mTorr.
[3]Substrate Bias Power in W.
[4]Substrate Temperature in ° C.
[5]Time in seconds.

TABLE TWO

Process Conditions for Via Etch Erosion Rate Test

| Via Etch Simulation | $CF_4$* | $C_4F_6$* | $CHF_3$* | $CH_2F_2$* | Ar* | $O_2$* | $N_2$* |
|---|---|---|---|---|---|---|---|
| Etch Step One | 80 | | | | | | 80 |
| Etch Step Two | | 28 | 15 | 20 | 500 | 31 | |
| Etch Step Three | | 40 | | | 650 | 30 | |
| Etch Step Four | | | | | 200 | | |
| Etch Step Five | | | | | 500 | | |

| Via Etch Simulation | Plasma Source Power[1] | Pr[2] | Substrate Bias Power[3] | Substrate Temp[4] | Time[5] |
|---|---|---|---|---|---|
| Etch Step One | | 80 | 400 | 40 | 50 |
| Etch Step Two | 400 | 30 | 1700 | 40 | 60 |
| Etch Step Three | | 30 | 1700 | 40 | 60 |
| Etch Step Four | 1000 | 50 | 100 | 40 | 45 |

*All gas flow rates are in sccm.
[1]Plasma Source Power in W.
[2]Pressure in mTorr.
[3]Substrate Bias Power in W.
[4]Substrate Temperature in ° C.
[5]Time in seconds.

TABLE THREE

Process Conditions for Metal Etch Erosion Rate Test

| Metal Etch Simul. | Cl$_2$* | BCl$_3$* | C$_2$H$_4$* | Ar* | CHF$_3$* | N$_2$* | Plasma Source Power[1] | Subr Bias Power[2] | Prc Pr[3] | Subr Temp[4] | Time[5] |
|---|---|---|---|---|---|---|---|---|---|---|---|
| Etch Step One   | 60 |    | 3  | 20 |   |   | 1000 | 100 | 8  | 40 | 30 |
| Etch Step Two   | 25 | 40 | 10 |    | 5 |   | 500  | 150 | 10 | 40 | 18 |
| Etch Step Three | 60 | 40 | 20 |    |   |   | 700  | 120 | 18 | 40 | 30 |
| Etch Step Four  | 60 | 40 | 3  |    |   |   | 1000 | 200 | 8  | 40 | 23 |
| Etch Step Five  | 30 | 60 | 5  | 50 |   | 5 | 800  | 170 | 6  | 40 | 15 |

*All gas flow rates are in sccm.
[1]Plasma Source Power in W.
[2]Substrate Bias Power in W.
[3]Pressure in mTorr.
[4]Substrate Temperature in ° C.
[5]Time in seconds.

Example Two

Comparative Relative Erosion Rates of Various Ceramic Materials Compared with Aluminum Oxide Aluminum oxide has frequently been used as a protective layer or liner when a semiconductor process makes use of an etchant plasma. Using aluminum oxide as the base comparative material, we determined the relative etch rates, in a Trench Etch (CF$_4$/CHF$_3$) environment. With aluminum oxide having a relative erosion rate of 1, we found that the relative erosion rate of quartz was about 2.2 times that of aluminum oxide. The relative erosion rate of silicon carbide was about 1.6 times that of aluminum oxide. The relative erosion rate of zirconia was about 0.8 times that of aluminum oxide. The relative erosion rate of pure yttrium oxide was about 0.19 times that of aluminum oxide. The relative erosion rate of a yttrium oxide, zirconium oxide, aluminum oxide ceramic composite, formed from 55 mole % yttrium oxide, 20 mole % zirconium oxide, and 25 mole % aluminum oxide was about 0.2 times that of aluminum oxide. The relative erosion rate of a yttrium oxide, zirconium oxide, aluminum oxide ceramic composite, formed from 63 mole % yttrium oxide, 23 mole % zirconium oxide, and 14 mole % aluminum oxide was about 0.05 times that of aluminum oxide.

Example Three

Measured Erosion Rates for Trench Etching Process

With reference to the trench etching method described above, the sample substrate test coupon erosion rates measured were as follows. The erosion rate of aluminum oxide was 1.1 μm/hr. The erosion rate of bulk yttrium oxide was 0.3 μm/hr. The erosion rate of a the a yttrium oxide, zirconium oxide, aluminum oxide ceramic composite, formed from 55 mole % yttrium oxide, 20 mole % zirconium oxide, and 25 mole % aluminum oxide was 0.1 μm/hr. The erosion rate of a yttrium oxide, zirconium oxide, aluminum oxide ceramic composite, formed from 63 mole % yttrium oxide, 23 mole % zirconium oxide, and 14 mole % aluminum oxide was 0.07 μm/hr.

Example Four

Measured Erosion Rates for Via Etching Process

With reference to the via etching method described above, the sample substrate test coupon erosion rates measured were as follows. The erosion rate of aluminum oxide was not measured. The erosion rate of bulk yttrium oxide was 0.16 μm/hr. The erosion rate of a the a yttrium oxide, zirconium oxide, aluminum oxide solid solution, formed from 55 mole % yttrium oxide, 20 mole % zirconium oxide, and 25 mole % aluminum oxide was 0.21 μm/hr. The erosion rate of a yttrium oxide, zirconium oxide, aluminum oxide solid solution, formed from 63 mole % yttrium oxide, 23 mole % zirconium oxide, and 14 mole % aluminum oxide was 0.22 μm/hr.

Example Five

Measured Erosion Rates for Metal Etching Process

With reference to the metal etching method described above, the sample substrate test coupon erosion rates measured were as follows. The erosion rate of aluminum oxide was 4.10 μm/hr. The erosion rate for bulk yttrium oxide was 0.14 μm/hr. The erosion rate of a the a yttrium oxide, zirconium oxide, aluminum oxide ceramic composite, formed from 55 mole % yttrium oxide, 20 mole % zirconium oxide, and 25 mole % aluminum oxide was 0.10 μm/hr. The erosion rate of a yttrium oxide, zirconium oxide, aluminum oxide ceramic composite, formed from 63 mole % yttrium oxide, 23 mole % zirconium oxide, and 14 mole % aluminum oxide was 0.18 μm/hr.

Example Six

Figure 1B:
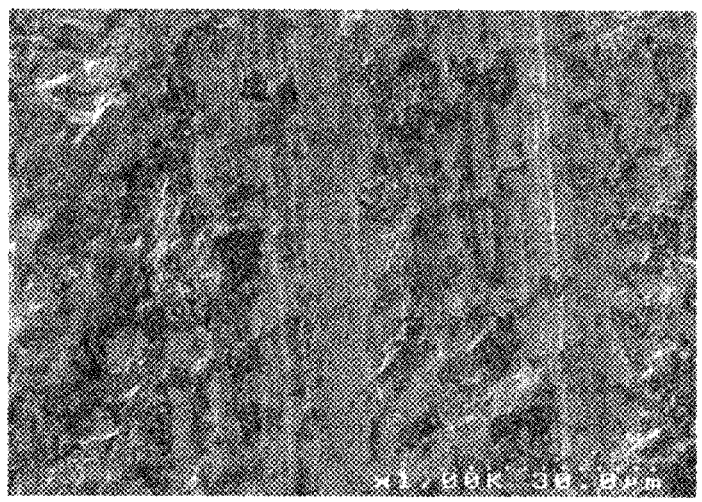
FIG. 1B shows a photomicrograph of the as-sintered surface of a solid solution ceramic substrate formed from 63 mole % yttrium oxide, 23 mole % zirconium oxide, and 14 mole % aluminum oxide, at a magnification of 1,000 times.
Figure 1C:
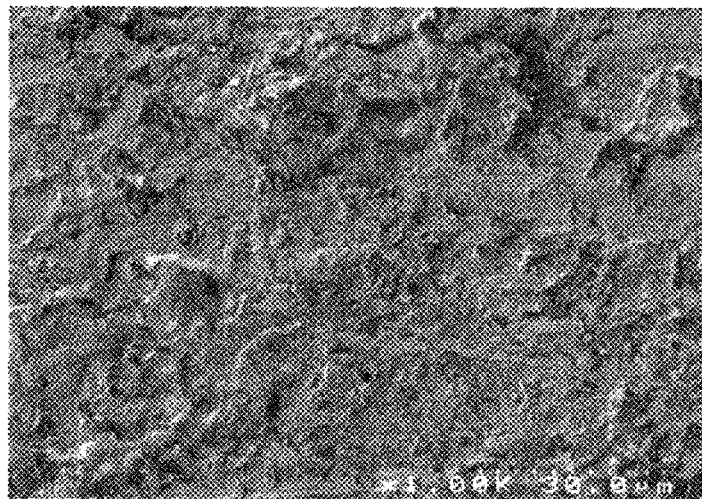
FIG. 1C shows a photomicrograph of the as-sintered surface of a solid solution ceramic substrate formed from 55 mole % yttrium oxide, 20 mole % zirconium oxide, and 25 mole % aluminum oxide, at a magnification of 1,000 times.

Photomicrographs of Yttrium-Oxide-Based Ceramics after Exposure to a Via Etch Process FIGS. 1A through 1C show photomicrographs of the surface of a sintered yttrium-oxide-containing ceramic composite prior to exposure to the via etch process described herein. The yttrium-oxide-containing ceramic composites include: 1) yttrium oxide-zirconium oxide solid solution; and 2) yttrium aluminate, when the composition was yttrium oxide 100 parts by weight, zirconium oxide 20 parts by weight, and aluminum oxide 10 parts by weight. (This composition is the same as 63 mole % yttrium oxide, 23 mole % zirconium oxide, and 14 mole % aluminum oxide); and 3) yttrium oxide-zirconium oxide-aluminum oxide solid solution, when the composition from which the solid solution was formed was yttrium oxide 100 parts by weight, zirconium oxide 20 parts by weight, and aluminum oxide 20 parts by weight. (This composition is the same as 55 mole % yttrium oxide, 20 mole % zirconium oxide, and 25 mole % aluminum oxide). All of the photomicrographs are at a magnification of 1,000 times.

Figure 2A:
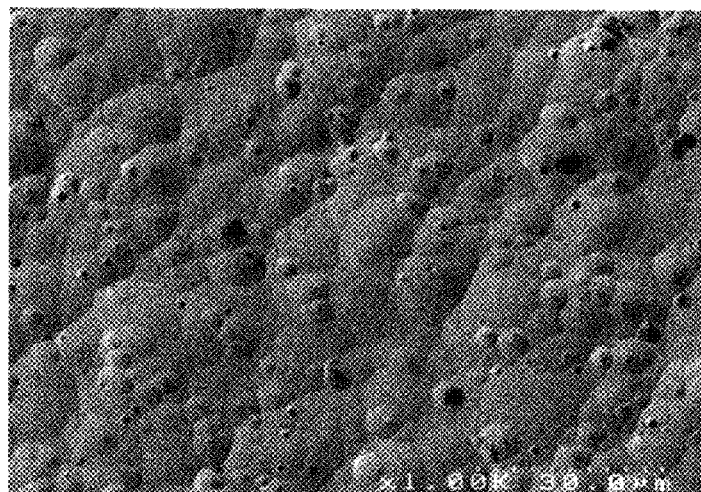
FIG. 2A shows a photomicrograph of the surface of a solid yttrium oxide ceramic after a test etch using the processing plasmas and times typically used to etch the various layers of a contact via feature in a semiconductor device. The magnification is 1,000 times.
Figure 2B:
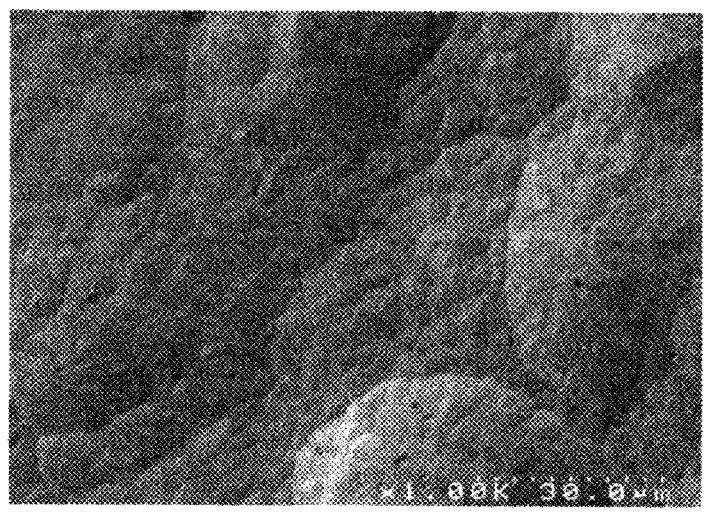
FIG. 2B shows a photomicrograph of the surface of a solid solution ceramic formed from 63 mole % yttrium oxide, 23 mole % zirconium oxide, and 14 mole % aluminum oxide after a test etch using the processing plasmas and times typically used to etch the various layers of a contact via feature in a semiconductor device. The magnification is 1,000 times.
Figure 2C:
FIG. 2C shows a photomicrograph of the surface of a solid solution ceramic formed from 55 mole % yttrium oxide, 20 mole % zirconium oxide, and 25 mole % aluminum oxide after a test etch using the processing plasmas and times typically used to etch the various layers of a contact via feature in a semiconductor device. The magnification is 1,000 times.

FIGS. 2A through 2C show photomicrographs of the sintered yttrium-oxide-containing ceramic composite subsequent to exposure to the via etch process described herein. The yttrium-oxide-containing ceramic composites include: 1) yttrium oxide-zirconium oxide solid solution; and 2) yttrium aluminate, when the composition was yttrium oxide 100 parts by weight, zirconium oxide 20 parts by weight, and aluminum oxide 10 parts by weight (This composition is the same as 63 mole % yttrium oxide, 23 mole % zirconium oxide, and 14 mole % aluminum oxide); or when the composition was yttrium oxide 100 parts by weight, zirconium oxide 20 parts by weight, and aluminum oxide 20 parts by weight (This composition is the same as 55 mole % yttrium oxide, 20 mole % zirconium oxide, and 25 mole % aluminum oxide). All of the photomicrographs are at a magnification of 1,000 times.

The surface roughness of the bulk yttrium oxide shown in FIG. 2A has increased in roughness substantially. However, the overall surface roughness appears to be less than that of the zirconium oxide and aluminum oxide containing sample coupons. The surface roughness of the solid solution shown in FIG. 2B, which contains 10 parts by weight aluminum oxide appears to have hills and valleys which are flatter than the hills and valleys of the solid solution shown in FIG. 2C, which contains the 20 parts by weight of aluminum oxide. However, the hills and valleys on the 10 parts by weight aluminum oxide sample coupon shown in FIG. 2B have more pitting on the surface than in the 20 parts by weight sample coupon shown in FIG. 2C.

Figure 3A:
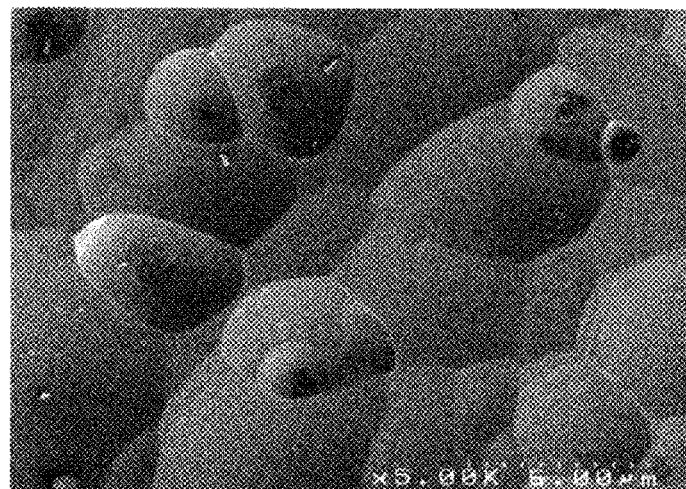
FIG. 3A shows a photomicrograph of the post-etch ceramic of FIG. 2A, but at a magnification of 5,000 times.
Figure 3B:
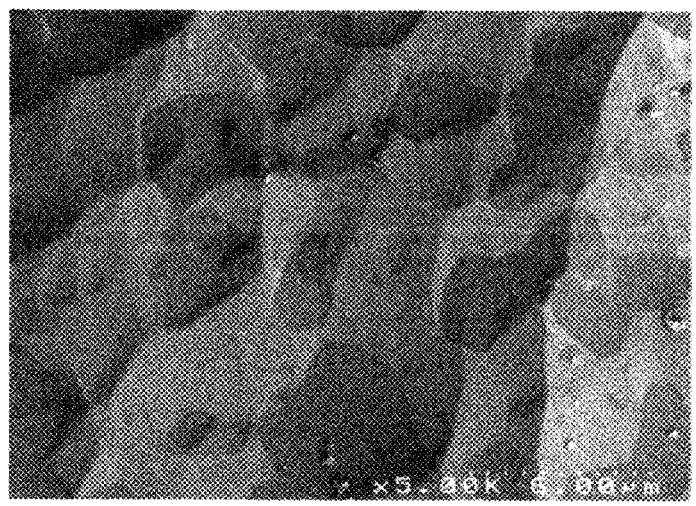
FIG. 3B shows a photomicrograph of the post-etch ceramic of FIG. 2B, but at a magnification of 5,000 times.
Figure 3C:
FIG. 3C shows a photomicrograph of the post-etch ceramic of FIG. 2C, but at a magnification of 5,000 times.

FIGS. 3A through 3C show photomicrographs which correspond with FIGS. 2A through 2C, respectively, but are at a magnification of 5,000 times. Looking at the surface of the bulk yttrium oxide sample coupon shown in FIG. 3A, the surface is relatively smooth but does show some evidence of small pits. The FIG. 3B solid solution formed from yttrium oxide 100 parts by weight, zirconium oxide 20 parts by weight, and aluminum oxide 10 parts by weight also shows some small scale pitting present on the rougher surface shown in FIG. 2B. The FIG. 3C solid solution formed from yttrium oxide 100 parts by weight, zirconium oxide 20 parts by weight, and aluminum oxide 20 parts by weigh shows negligible small scale pitting.

Looking at the erosion rates for the three test coupons, it appears that the 1,000 times magnification for the post-etch coupons shows better surface characteristics related to the erosion rates of the coupons. The erosion rates were 0.16 µm/hr for the solid yttrium oxide shown in FIG. 2A; 0.22 µm/hr for the solid solution of yttrium oxide-zirconium oxide-aluminum oxide which contained 10 parts by weight aluminum oxide; and 0.21 µm/hr for the solid solution of yttrium oxide-zirconium oxide-aluminum oxide which contained 20 parts by weight aluminum oxide.

Example Seven

Figure 4A:
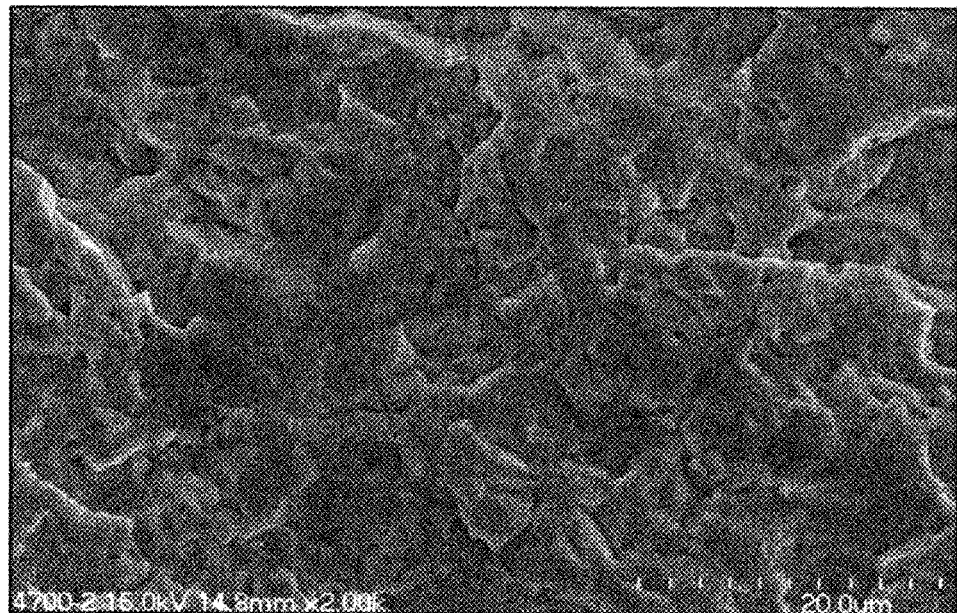
FIG. 4A shows a photomicrograph of the as-sintered surface of a solid solution ceramic formed from 63 mole % yttrium oxide, 23 mole % zirconium oxide, and 14 mole % aluminum oxide. The magnification is 2,000 times.
Figure 4B:
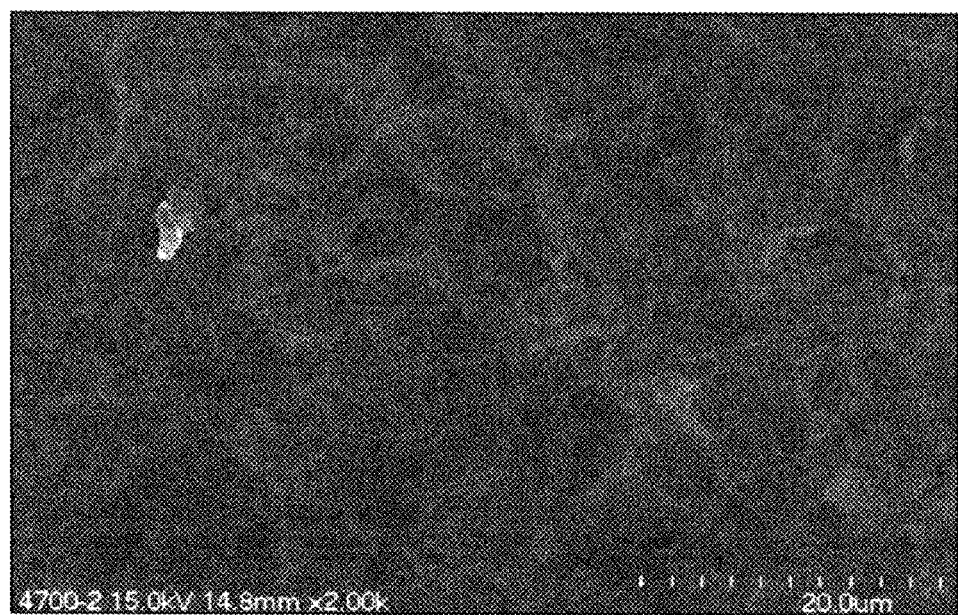
FIG. 4B shows a photomicrograph of the surface of the solid solution ceramic shown in FIG. 4A, after exposure of the test coupon to a trench etch process of the kind described herein. The magnification is 2,000 times.

Photomicrographs of Yttrium-Oxide-Containing Substrates after Exposure to a Trench Etch Process FIG. 4A shows a photomicrograph of the as-sintered surface of a solid solution ceramic composite containing 100 parts by weight yttrium oxide, 20 parts by weight aluminum oxide, and 10 parts by weight aluminum oxide (63 mole % yttrium oxide, 23 mole % zirconium oxide, and 14 mole % aluminum oxide), at a magnification of 2,000 times. FIG. 4B shows a photomicrograph of the surface of the solid ceramic composite of FIG. 4A after etching by a trench etch process of the kind shown herein. Both photomicrographs are at a magnification of 2,000. The post-etched surface appears to be flat and relatively homogeneous. This combination of photographs suggests that after fabrication of an apparatus such as a chamber liner or a component part, it may be advisable to "season" the part by exposing it to an exemplary plasma etch process prior to introducing the apparatus into a semiconductor device production process. The erosion rate for the solid solution ceramic composite containing the 10 parts by weight of aluminum oxide, after exposure to the trench etch process, was about 0.08 em/hr.

Figure 4C:
FIG. 4C shows a photomicrograph of the as sintered surface of a solid solution ceramic formed from 55 mole % yttrium oxide, 20 mole % zirconium oxide, and 25 mole % aluminum oxide. The magnification is 2,000 times.
Figure 4D:
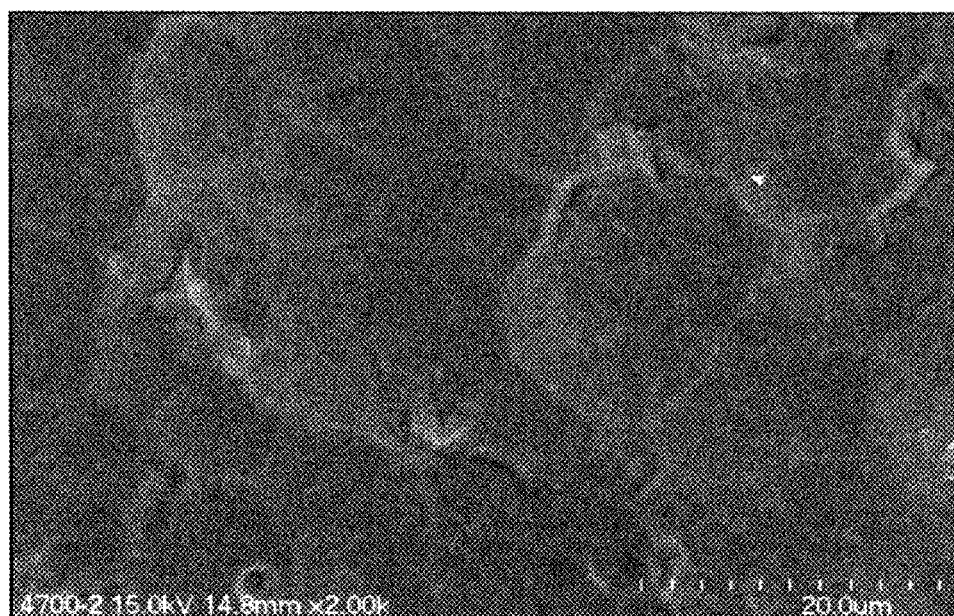
FIG. 4D shows a photomicrograph of the surface of the solid solution ceramic shown in FIG. 4C, after exposure of the test coupon to a trench etch process of the kind described herein. The magnification is 2,000 times.

FIG. 4C shows a photomicrograph of the as-sintered surface of a solid solution ceramic composite containing 100 parts by weight yttrium oxide, 20 parts by weight aluminum oxide, and 20 parts by weight aluminum oxide (55 mole % yttrium oxide, 20 mole % zirconium oxide, and 25 mole % aluminum oxide). FIG. 4D shows a photomicrograph of the surface of the solid solution ceramic composite of FIG. 4C after etching by a trench etch process of the kind shown herein. Both photomicrographs are at a magnification of 2,000. The post-etched surface appears to be flat and relatively homogeneous. This combination of photographs suggests the same seasoning process described above for newly fabricated apparatus. The erosion rate of the solid solution ceramic composite containing the 20 parts by weight of aluminum oxide, after exposure to the trench etch process, was about 0.07 µm/hr.

Example Eight

Figure 5A:
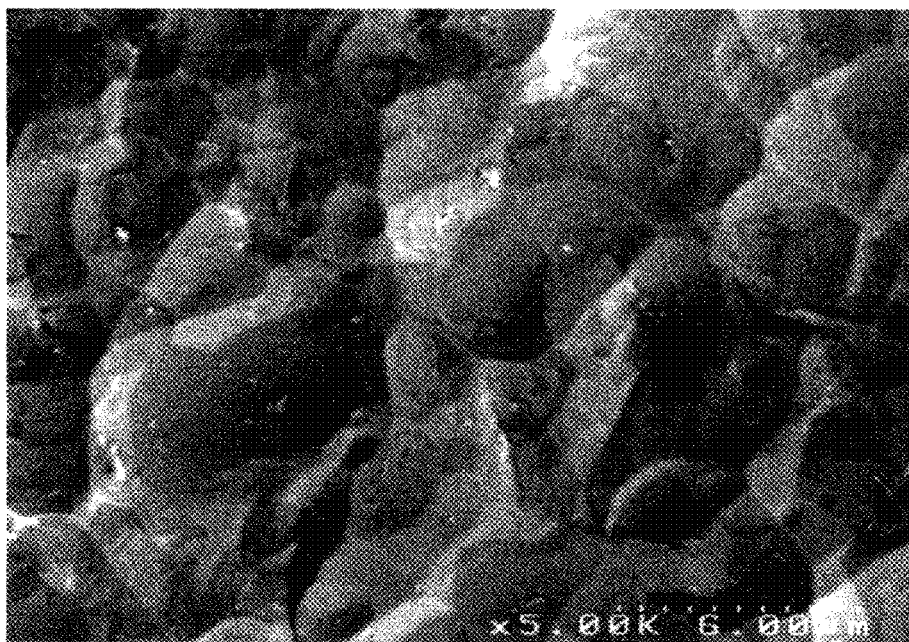
FIG. 5A shows a photomicrograph of a solid solution ceramic formed from 63 mole % yttrium oxide, 23 mole % zirconium oxide, and 14 mole % aluminum oxide after exposure of the test coupon to a metal etch process of the kind described herein. The magnification is 5,000 times.
Figure 5B:
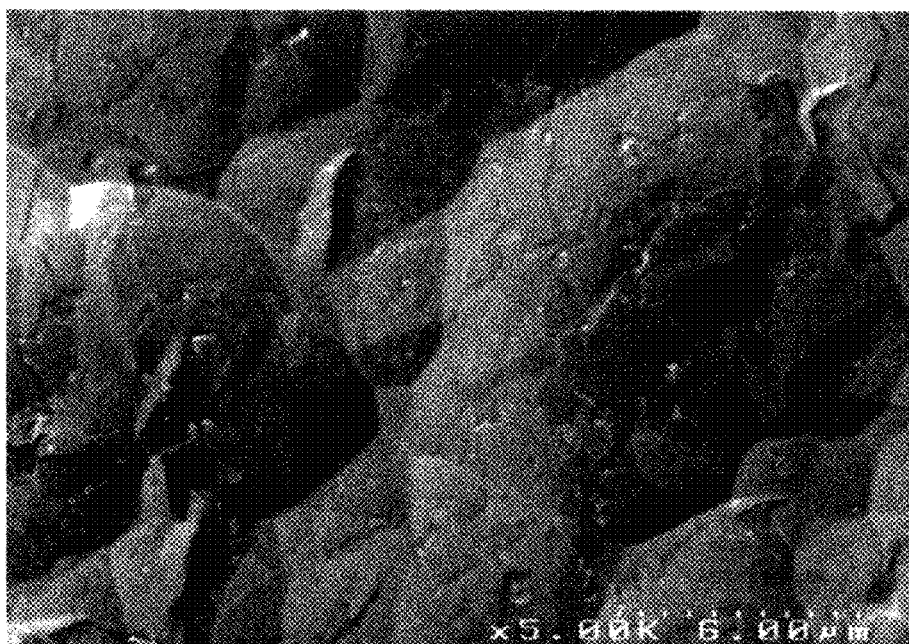
FIG. 5B shows a photomicrograph of a solid solution ceramic formed from 55 mole % yttrium oxide, 20 mole % zirconium oxide, and 25 mole % aluminum oxide after exposure of the test coupon to an etch by a $CF_4/CHF_3$ plasma. The magnification is 5,000 times.

Photomicrographs of Yttrium-Oxide-Containing Ceramic Composites after Exposure to a Metal Etch Process FIG. 5A shows a photomicrograph of a two phase solid solution ceramic composite formed from 100 parts by weight of yttrium oxide, 20 parts by weight of zirconium oxide and 10 parts by weight of aluminum oxide (63 mole % yttrium oxide, 23 mole % zirconium oxide, and 14 mole % aluminum oxide) after exposure of the test coupon to a metal etch process of the kind described herein. The magnification is 5,000 times. FIG. 5B shows a photomicrograph of a two phase solid solution ceramic composite formed from 100 parts by weight of yttrium oxide, 20 parts by weight of zirconium oxide, and 20 parts by weight of aluminum oxide (55 mole % yttrium oxide, 20 mole % zirconium oxide, and 25 mole % aluminum oxide) after exposure of the test coupon to a metal etch process of the kind described herein. The magnification is 5,000 times. A comparison of these two photomicrographs shows that the two phase solid solution containing the higher content of aluminum oxide has an increased amount of the darker phase, which is yttrium aluminate. The erosion rate of the two phase solid solution ceramic composites containing the 10 parts by weight of aluminum oxide, after exposure to the trench etch process, was about 0.18 µm/hr, while the erosion rate of the two phase solid solution ceramic composite containing the 20 parts by weight of aluminum oxide, after exposure to the trench process was about 0.10 µm/hr.

Example Nine

Relative Physical and Mechanical Properties of Yttrium-Oxide-Containing Substrates Table Four below shows comparative physical and mechanical properties for the bulk, pure yttrium oxide ceramic and for various yttrium-oxide containing solid solution ceramics.

TABLE FOUR

| Material Starting Composition | $Y_2O_3$ | $Al_2O_3$ | $100ZrO_2$ $3Y_2O_3$ parts by weight | $100Y_2O_3$ $20ZrO_2$ parts by weight | $100Y_2O_3$ $20ZrO_2$ $10Al_2O_3$ parts by weight | $100Y_2O_3$ $20ZrO2$ $20Al_2O_3$ parts by weight |
|---|---|---|---|---|---|---|
| Flexural Strength (MPa) | 100-150 | 400 | 1200 ± 100 | 137 | 215 | 172 |
| Vickers Hardness (5 Kgf)(GPa) | 5.7 | 17.2 | 11.9 | 9.3 | 9.4 | 9.6 |
| Young's Modulus (GPa) | 140-170 | 380 | 373 | 190 | 190 | 202 |
| Fracture Toughness (MPa · m$^{1/2}$) | 1.0-1.3 | 3.5 | 10.9 | 1.3 | 1.6 | 1.7 |
| Thermal Conductivity (W/m/°K) | 13.7 | 33 | 2.9 | 4.7 | 3.5 | |
| Thermal Shock Resistance (ΔT) °C. | 130-200 | 200 | | 130-200 | 150-200 | |
| Thermal Expansion × $10^{-6}$/K (20-900° C.) | 7.2 | 7.7 | 9.4 | 9.0 | 8.5 | |
| Dielectric Constant (20° C. 13.56 MHZ) | 12.3-13 | 9.9 | — | 15.0 | 15.5 | |
| Dielectric Loss Tangent × $10^{-4}$ (20° C. 13.56 MHZ) | <20 | 0.5 | — | <20 | <20 | — |
| Volume Resistivity at RT (Ω · cm) | $10^{12}$-$10^{13}$ | $10^{15}$ | — | $10^{11}$ | $10^{16}$-$10^{22}$ | — |
| Density (g/cm$^3$) | 4.92 | 3.95 | 5.89 | 5.19 | 4.90 | 4.86 |
| Mean Grain Size (μm) | 10-25 | — | 0.5-1.0 | 5-10 | 3-6 | 3-6 |
| Phase Composition | $Y_2O_3$ | $Al_2O_2$ | $Zr_{1-x}Y_xO_2$ | F/C-$Y_2O_3$ SS | F/C-$Y_2O_3$ SS and $Y_4Al_2O_9$ | F/C-$Y_2O_3$ SS $Y_4Al_2O_9$ and $YAlO_3$ |
| Plasma Erosion Rate (μm/hr) (CF$_4$/CHF$_3$) | 0.3 | 1.44 | 0.3 | 0.1 | 0.1 | 0.2 |

*All of the solid solution ceramic substrates were sintered using a pressureless sintering technique under a hydrogen protected atmosphere.

A review of the plasma erosion rate clearly shows the advantages of the solid solution yttrium oxide, zirconium oxide, aluminum oxide ceramics which have been described herein. We have demonstrated that it is possible to reduce the erosion rate of a ceramic material of this kind, while maintaining acceptable mechanical properties, which enable easier handling of the apparatus without risk of damage to the apparatus.

Combinations of yttrium oxide, zirconium oxide and aluminum oxide have been evaluated, and we have discovered that ceramic materials formed from starting compositions in which the $Y_2O_3$, yttrium oxide, molar concentration ranges from about 50 mole % to about 75 mole %; the $ZrO_2$, zirconium oxide, molar concentration ranges from about 10 mole % to about 30 mole %; and, the $Al_2O_3$, aluminum oxide, molar concentration ranges from about 10 mole % to about 30 mole %, provide excellent erosion resistance to halogen containing plasmas while providing advanced mechanical properties which enable handling of solid ceramic processing components with less concern about damage to a component. In many applications, a starting composition for the ceramic materials may be one in which $Y_2O_3$ molar concentration ranges from about 55 mole % to about 65 mole %, the $ZrO_2$ molar concentration ranges from about 10 mole % to about 25 mole % and the $Al_2O_3$ molar concentration ranges from about 10 mole % to about 20 mole %. When the erosion rate is of great concern, starting material concentration of the ceramic material may be one in which $Y_2O_3$ molar concentration ranges from about 55 mole % to about 65 mole %, the $ZrO_2$ molar concentration ranges from about 20 mole % to about 25 mole % and the $Al_2O_3$ molar concentration 5 mole % to about 10 mole %.

Starting material compositions of the kind described above may be used to form a ceramic coating over the surface of a variety of metal or ceramic substrates, including but not limited to aluminum, aluminum alloy, stainless steel, alumina, aluminum nitride, and quartz, using a technique well known in the art, such as plasma spray, for example and not by way of limitation. However, with the improved mechanical properties which have been obtained, it is recommended that solid ceramic apparatus components be used when possible, to prevent sudden failure of plasma resistance due to coating layer flaking off, or defects in the coating which appear as the coating thins, or the formation of metal contamination by mobile impurities from the underlying substrate which migrate into the coating.

The addition of a concentration of zirconium oxide, ranging from about 0.1 mole % to about 65 mole % to what was a pure yttrium oxide, provides a solid solution of yttrium oxide and zirconium oxide with the cubic yttria crystal structure or cubic fluorite-type crystal structure, where the cell parameter is smaller than that of the pure structure, due to the formation of yttrium vacancy/oxygen vacancy, respectively. The smaller cell parameter of the solid solution crystal structure improves the plasma resistance properties of the solid solution of zirconium oxide in yttrium oxide. For example, the erosion rate of a solid yttrium oxide ceramic in a $CF_4/CHF_3$ plasma of the kind used to etch a trench in a multilayered semiconductor substrate is about 0.3 µm/hr. The erosion rate of a solid solution ceramic of about 69 mole % yttrium oxide and about 31 mole % zirconium oxide is about 0.1 µm/hr, a 3 times slower etch rate than solid yttrium oxide. This unexpected decrease in etch rate extends the lifetime of a process chamber liner or an internal apparatus component within the process chamber, so that: the replacement frequency for such apparatus is reduced, reducing apparatus down time; the particle amount generated during a process is reduced, improving the product properties; the metal contamination generated during a process is reduced, advancing the product properties; and the overall will reduce the overall cost of the processing apparatus per wafer processed will be reduced, on the average.

While the 0.1 µm/hr erosion rate for the zirconium oxide-containing yttrium oxide solid solution is surprisingly better than that of yttrium oxide at 0.3 µm/hr, and considerably better than of a solid aluminum oxide ceramic at 1.44 µm/hr in the $CF_4/CHF_3$ plasma, the mechanical properties of the zirconium oxide-containing yttrium oxide solid solution illustrate that an improvement in flexural strength and fracture toughness would be helpful.

In one embodiment, the flexural strength and fracture toughness of the zirconium oxide-containing yttrium oxide solid solution are achieved, by adding various amounts of aluminum oxide to the formula for the solid solution ceramic to form an additional yttrium aluminate phase. The mixture of oxides was compacted by unidirectional mechanical pressing or cold isostatic pressing of a granular powder formed by spray drying, in combination with a typical content of binders. The green body was then pressureless sintered using techniques generally known in the art. The addition of 10 mole % to 30 mole % of alumina significantly improved the mechanical properties of the sintered ceramic composition in terms of flexural strength and fracture toughness. For example, the erosion rate of the ceramic containing 69 mole % yttrium oxide and 31 mole % zirconium oxide, after exposure to a plasma containing $CF_4$ and $CHF_3$, was about 0.1 µm/hr. For the ceramic containing about 14 mole % aluminum oxide, the erosion rate after exposure to the same plasma was also about 0.1 µm/hr. For the ceramic containing about 25 mole % aluminum oxide, the erosion rate after exposure to the same plasma was about 0.2 µm/hr. With respect to the mechanical properties, for example, an overall starting composition which is about 69 mole % yttrium oxide and about 31 mole % zirconium oxide, after sintering exhibits a flexural strength of about 137 MPa, and a fracture toughness of 1.3 MPa·m$^{1/2}$, as discussed above. When the overall ceramic composition is about 63 mole % yttrium oxide, about 23 mole % zirconium oxide, and about 14 mole % aluminum oxide, after sintering the flexural strength is about 215 MPa and the fracture toughness is about 1.6 Mpa·m$^{1/2}$. When the overall ceramic composition is about 55 mole % yttrium oxide, about 20 mole % zirconium oxide, and about 25 mole % aluminum oxide, after sintering the flexural strength is about 172 MPa and the fracture toughness is about 1.7 MPa·m$^{1/2}$. The relationship between aluminum oxide content, increase in flexural strength, and increase in erosion rate is not a linear relationship. However, one of skill in the art can optimize the formula with minimal experimentation, in view of the information provided herein.

As an alternative to adding aluminum oxide to a multi-phase metal stable composition containing yttrium oxide and zirconium oxide is to add $HfO_2$, hafnium oxide; $Sc_2O_3$, scandium oxide; $Nd_2O_3$, neodymium oxide; $Nb_2O_5$, niobium oxide; $Sm_2O_3$, samarium oxide; $Yb_2O_3$, ytterbium oxide; $Er_2O_3$, erbium oxide; $Ce_2O_3$ (or $CeO_2$), cerium oxide, or combinations thereof. In the instance where these alternative compounds are used, the concentration of the alternative compound in the starting material formulation ranges from about 0.1 mole % to about 90 mole %. Typically the concentration used will range from about 10 mole % to about 30 mole %.

After mixing of at least one of the alternative oxides listed above with the $Y_2O_3$ and $ZrO_2$ powders used to form a solid solution, the combination of powders was compacted by unidirectionally mechanical pressing or cold isostatic pressing of the granular powder formed by spray drying with a typical content of binders. The green body was then pressureless sintered using techniques known in the art. Upon cooling of the sintered body, a single phase or two phase solid solution forms, where the solid solution is a "multi-element-doped" solid solution. One solid solution exhibits a cubic yttria crystal structure, and another solid solution exhibits the cubic fluorite-type crystal structure. The solid solution has excellent plasma resistance, typically better erosion resistance than that of the aluminum oxide-comprising solid solutions discussed herein. However, the mechanical properties of the yttria-zirconia-alumina system are somewhat better. All of these multi-doped solid solutions exhibit excellent plasma erosion resistance and improved mechanical properties in comparison with previously known yttrium oxide-zirconium oxide solid solutions.

Typical applications for a yttrium oxide-comprising substrate of the kind described herein include, but are not limited to components used internal to a plasma processing chamber, such as a lid, lid-liner, nozzle, gas distribution plate or shower head, electrostatic chuck components, shadow frame, substrate holding frame, processing kit, and chamber liner. All of these components are well known in the art to those who do plasma processing.

The above described exemplary embodiments are not intended to limit the scope of the present invention, as one skilled in the art can, in view of the present disclosure, expand such embodiments to correspond with the subject matter of the invention claimed below.

What is claimed is:

1. A coated article that is resistant to erosion by halogen-containing plasmas, the coated article comprising an article and a ceramic coating formed on the article, wherein the ceramic coating comprises:
   yttrium oxide at a concentration from 65.9 mole % to 80 mole %; and
   zirconium oxide at a concentration from 34.1 mole % to 20 mole %.

2. The coated article of claim 1, wherein the ceramic coating consists essentially of:
   the yttrium oxide at a concentration from 65.9 mole % to 80 mole %; and
   the zirconium oxide at a concentration from 34.1 mole % to 20 mole %.

3. The coated article of claim 1, wherein the ceramic coating consists of:
   the yttrium oxide at a concentration from 65.9 mole % to 80 mole %; and the zirconium oxide at a concentration from 34.1 mole % to 20 mole %.

4. The coated article of claim 1, wherein the ceramic coating comprises:
the yttrium oxide at a concentration from 65.9 mole % to 73.2 mole %; and
the zirconium oxide at a concentration from 34.1 mole % to 26.8 mole %.

5. The coated article of claim 1, wherein the ceramic coating consists essentially of:
yttrium oxide at a concentration from 65.9 mole % to 73.2 mole %; and
zirconium oxide at a concentration from 34.1 mole % to 26.8 mole %.

6. The coated article of claim 1, wherein the ceramic coating consists of:
the yttrium oxide at a concentration from 65.9 mole % to 73.2 mole %; and
the zirconium oxide at a concentration from 34.1 mole % to 26.8 mole %.

7. The coated article of claim 1, wherein the ceramic coating comprises a solid solution of the yttrium oxide and the zirconium oxide.

8. The coated article of claim 1, wherein the article is a semiconductor processing chamber component selected from a group consisting of a lid, a lid liner, a nozzle, a gas distribution plate, a shower head, an electrostatic chuck component, a shadow frame, a substrate holding frame, a processing kit, and a chamber liner.

9. The coated article of claim 1, wherein the ceramic coating is formed on the article using a technique selected from a group consisting of thermal spraying, plasma spraying, sputtering, and chemical vapor deposition.

10. A semiconductor processing apparatus adapted to have at least one surface exposed to a halogen-comprising plasma during a process performed in a semiconductor processing chamber, the semiconductor processing apparatus comprising the coated article of claim 1.

* * * * *